United States Patent
Wang et al.

(10) Patent No.: US 12,058,864 B2
(45) Date of Patent: Aug. 6, 2024

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Qingqing Wang, Hubei (CN); Wei Xu, Hubei (CN); Wenbin Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 877 days.

(21) Appl. No.: 17/018,155

(22) Filed: Sep. 11, 2020

(65) Prior Publication Data

US 2021/0296345 A1  Sep. 23, 2021

Related U.S. Application Data

(63) Continuation of application No. PCT/CN2020/080422, filed on Mar. 20, 2020.

(51) Int. Cl.
*H10B 43/50* (2023.01)
*H01L 21/768* (2006.01)
*H01L 23/535* (2006.01)
*H10B 41/27* (2023.01)
*H10B 41/50* (2023.01)
(Continued)

(52) U.S. Cl.
CPC ....... *H10B 43/50* (2023.02); *H01L 21/76805* (2013.01); *H01L 21/76895* (2013.01); *H01L 23/535* (2013.01); *H10B 41/27* (2023.02); *H10B 41/50* (2023.02); *H10B 43/27* (2023.02)

(58) Field of Classification Search
None
See application file for complete search history.

(56) References Cited

U.S. PATENT DOCUMENTS 9,397,043 B1  7/2016  Minemura
10,192,880 B2  1/2019  Lee
(Continued)

FOREIGN PATENT DOCUMENTS

CN  103579125 A  2/2014
CN  103824859 A  5/2014
(Continued)

OTHER PUBLICATIONS

International Search Report and Written Opinion of the International Searching Authority directed to related International Patent Application No. PCT/CN2020/080422, mailed Dec. 21, 2020; 6 pages.

*Primary Examiner* — Herve-Louis Y Assouman
(74) *Attorney, Agent, or Firm* — Sterne, Kessler, Goldstein & Fox P.L.L.C.

(57) ABSTRACT

A method for forming a 3D memory device is disclosed. The method includes forming an alternating dielectric stack on a substrate. Then a plurality of channel structures and dummy channel structures vertically penetrating the alternating dielectric stack are formed, The channel structures are located in a core region, and the dummy channel structures are located in a staircase region. A gate line silt structure is formed vertically penetrating the alternating dielectric stack and laterally extending in a first direction. The gate line silt structure includes a narrow portion that has a reduced width along a second direction different from the first direction.

20 Claims, 8 Drawing Sheets (51) Int. Cl.
*H10B 43/10* (2023.01)
*H10B 43/27* (2023.01)
*H10B 43/30* (2023.01)

(56) References Cited

U.S. PATENT DOCUMENTS

| | | | |
|---|---|---|---|
| 10,522,561 | B2 | 12/2019 | Zhang et al. |
| 10,566,346 | B2 | 2/2020 | Lee et al. |
| 10,797,076 | B2 | 10/2020 | Hua et al. |
| 10,886,291 | B2 | 1/2021 | Lu et al. |
| 10,950,623 | B2 | 3/2021 | Song et al. |
| 10,971,517 | B2 | 4/2021 | Liu et al. |
| 11,545,505 | B2 | 1/2023 | Lu et al. |
| 2013/0009236 | A1 | 1/2013 | Lee et al. |
| 2014/0035024 | A1 | 2/2014 | Noh |
| 2014/0138765 | A1 | 5/2014 | Lee et al. |
| 2016/0049421 | A1 | 2/2016 | Zhang et al. |
| 2019/0067314 | A1* | 2/2019 | Lu .............. H01L 24/05 |
| 2019/0081059 | A1* | 3/2019 | Xu .............. H10B 43/35 |
| 2020/0083250 | A1 | 3/2020 | Jung et al. |
| 2020/0328225 | A1 | 10/2020 | Xiao |

FOREIGN PATENT DOCUMENTS

| | | |
|---|---|---|
| CN | 108807411 A | 11/2018 |
| CN | 110062958 A | 7/2019 |
| CN | 110137179 A | 8/2019 |
| CN | 110197830 A | 9/2019 |
| CN | 110649033 A | 1/2020 |
| TW | 201830670 A | 8/2018 |
| TW | 201901932 A | 1/2019 |
| TW | I 677970 B | 11/2019 |
| TW | I 681549 B | 1/2020 |
| TW | I 683424 B | 1/2020 |

* cited by examiner

THREE-DIMENSIONAL MEMORY DEVICES AND FABRICATING METHODS THEREOF

CROSS-REFERENCE TO RELATED APPLICATIONS

This application claims priority to PCT Application No. PCT/CN2020/080422, filed on Mar. 20, 2020, which is incorporated herein by reference in its entirety.

TECHNICAL FIELD

The present disclosure generally relates to the field of semiconductor technology, and more particularly, to a method for forming a three-dimensional (3D) memory device.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers to improve the area utilization of wafers. In some existing 3D NAND memory devices, such as in some existing 128-layer 3D memory device designs, the channel holes in core/staircase transition area change from 9 rows to 3 rows in each memory finger. Stress simulation results show great stress change in the core/staircase transition area which may cause the tilt of the gate line slit structure between memory fingers. The gate line slit structure tilting can induce various leakage problems, such as leakages between word lines, leakages between word line and array common source, etc. Accordingly, it is desired to develop new 3D memory device designs to address such problems.

BRIEF SUMMARY

Embodiments of three-dimensional (3D) memory devices and fabricating methods thereof are disclosed herein.

One aspect of the present disclosure provides a method for forming a three-dimensional (3D) memory device. The method can comprises (bulling an alternating dielectric stack on a substrate. The method further comprises forming a plurality of channel structures and dummy channel structures vertically penetrating the alternating dielectric stack. The channel structures are located in a core region, and the dummy channel structures are located in a staircase region. The method further comprises forming a gate line slit structure vertically penetrating the alternating dielectric stack and laterally extending in a first direction. The gate line slit structure includes a narrow portion that has a reduced width along a second direction different from the first direction.

In some embodiments, forming the gate line slit structure comprises patterning a mask layer to form an opening extending in the first direction on the alternating dielectric stack, wherein the opening includes a narrow portion having a reduced width along the second direction. Forming the gate line slit structure comprises further comprises using the pattered mask layer to form a gate line slit vertically penetrating the alternating dielectric stack. Forming the gate line slit structure comprises further comprises forming the gate line slit structure in the gate line slit.

In some embodiments, forming the gate line slit comprises etching the alternating dielectric stack based on the patterned mask layer to form the gate line slit, such that a narrow portion of the formed gate line slit being close to a transition area of the core region and the staircase region.

In some embodiments, forming the gate line slit structure comprises forming a doped region in the substrate at a bottom of the gate line slit, forming two spacer layers on both sidewalls of the gate line slit, and forming a conductive wall between the two spacer layers, wherein the conductive wall is electrically in contact with the doped region.

In some embodiments, forming the gate line slit structure comprises forming the gate line slit structure in the gate line slit, such that a distance between the gate line slit structure and at least two channel structures that are adjacent to the gate line slit structure and close to the transition area of the core region and the staircase region is not less than about 120 nm.

In some embodiments, forming the alternating dielectric stack comprises forming at least 64 dielectric layer pairs stacked in a vertical direction, wherein each dielectric layer pair includes a first dielectric layer and a second dielectric layer that is different from the first dielectric layer.

In some embodiments, forming the plurality of channel structures and dummy channel structures comprises simultaneously forming a plurality of channel holes vertically penetrating the alternating dielectric stack, wherein a first subset of channel holes in the core region are arranged in a staggered array form, and a second subset of channel holes in the staircase region are arranged in an array form, and simultaneously formed the channel structures in the first subset of channel holes and the dummy channel structures in the second subset of channel holes.

In some embodiments, simultaneously forming the plurality of channel structures and dummy channel structures comprises forming an epitaxial layer on a surface of the substrate that is exposed by each channel hole, followed by forming a functional layer on sidewalls of each channel hole, followed by forming a channel layer covering the functional layer and in contact with the epitaxial layer in each channel hole, followed by forming a dielectric filling structure filling each channel hole, and followed by forming a channel plug on a top portion of each channel hole and on the dielectric filling structure.

In some embodiments, before forming the gate line slit structure in the gate line slit, the method further comprises replacing the second dielectric layers in the alternating dielectric stack with conductive layers through the gate line slit.

In some embodiments, replacing the second dielectric layers in the alternating dielectric with conductive layers comprises removing the second dielectric layers in the alternating dielectric stack through the gate line slit to form a plurality of horizontal trenches, and forming the conductive layers in the plurality of horizontal trenches.

Another aspect of the present disclosure provides a three-dimensional (3D) memory device. The device comprises an alternating conductive/dielectric stack on a substrate, and a plurality of channel structures and dummy channel structures vertically penetrating the alternating conductive/dielectric stack. The channel structures are located in a core region, and the dummy channel structures are located in a staircase region. The device further comprises a gate line slit structure vertically penetrating the alternating conductive/dielectric stack and laterally extending in a first direction. The gate line slit structure includes a narrow portion that has a reduced width along a second direction different from the first direction.

In some embodiments, the first direction is a word line direction, and the second direction is a bit line direction.

In some embodiments, the reduced width of the narrow portion of the gate line slit structure is at least 40 nm less than a normal width of a normal portion of the gate line slit structure.

In some embodiments, the reduced width of the narrow portion of the gate line slit structure is at least 70 nm.

In some embodiments, a length of the narrow portion of the gate line slit structure along the first lateral direction is not less than two times a diameter of the channel structures plus a distance between two adjacent channel structures.

In some embodiments, a length of the narrow portion of the gate line slit structure along the first lateral direction is not less than in a range between 300 nm to 500 nm.

In some embodiments, the gate line slit structure comprises a conductive wall between two spacer layers and electrically in contact with a doped region of the substrate.

In some embodiments, a distance between the gate line slit structure and at least two channel structures that are adjacent to the gate line slit structure and close to a transition area of the core region and the staircase region is not less than about 120 mm.

In some embodiments, the alternating dielectric stack comprises at least 64 conductive/dielectric layer pairs stacked in a vertical direction.

In some embodiments, each channel structure comprises an epitaxial layer on a bottom portion of a channel hole, a functional layer on a sidewall of the channel hole, a channel layer covering the functional layer and in contact with the epitaxial layer, a dielectric filling structure filling the channel hole, and a channel plug on a top portion of the channel hole and on the dielectric filling structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of lateral planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

Various embodiments in accordance with the present disclosure provide a method for forming a 3D memory device with a top selective gate cut structure for a memory array (also referred to herein as an "array device").

Figure 1A:
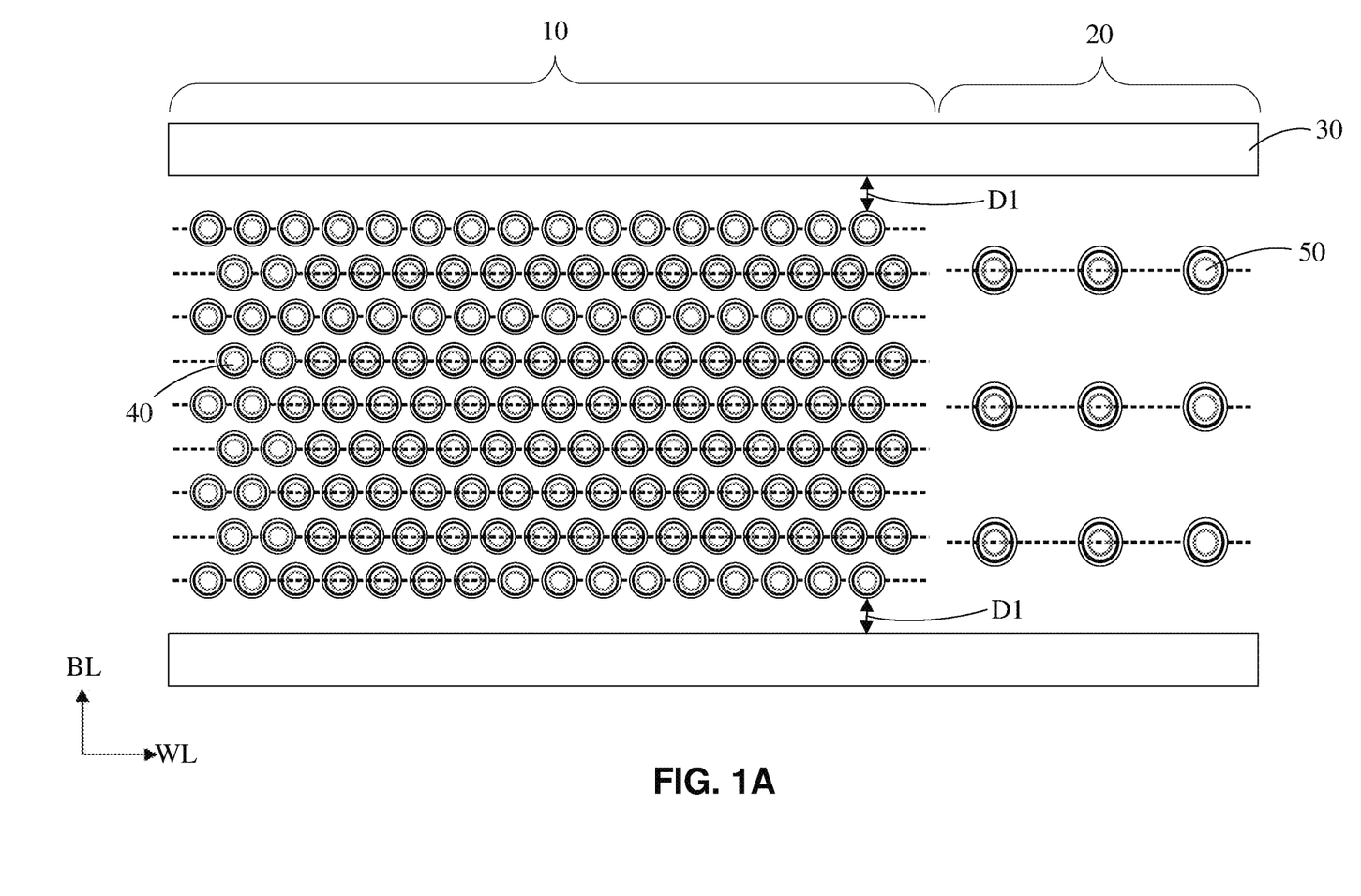
FIGS. 1(A) and 1(B) illustrate a top view of an exemplary 3D memory device.

Referring to FIG. 1(A), a schematic diagram of a 3D memory device is shown in a top view. As shown, in some existing 3D NAND memory devices, multiple gate line slit structures 30 can extend in parallel along a first lateral direction (e.g., word line direction "WL") to divide the memory array into multiple memory fingers. The memory array can include a core region 10 and a staircase region 20. In the core region 10, each memory finger can include a first number rows (e.g., 9 rows) of channel structures 40 arranged in a staggered manner between two adjacent slit structures 30. As shown in FIG. 1(A), a distance D1 of the channel structures 40 that are adjacent to the gate line slit structure 30 is generally less than 100 nm. In the staircase region, each memory finger can include a second number rows (e.g., 3 rows) of dummy channel structures 50 arranged in an array form between two adjacent gate line slit structures 30. The second number is smaller than the first number.

Figure 1B:
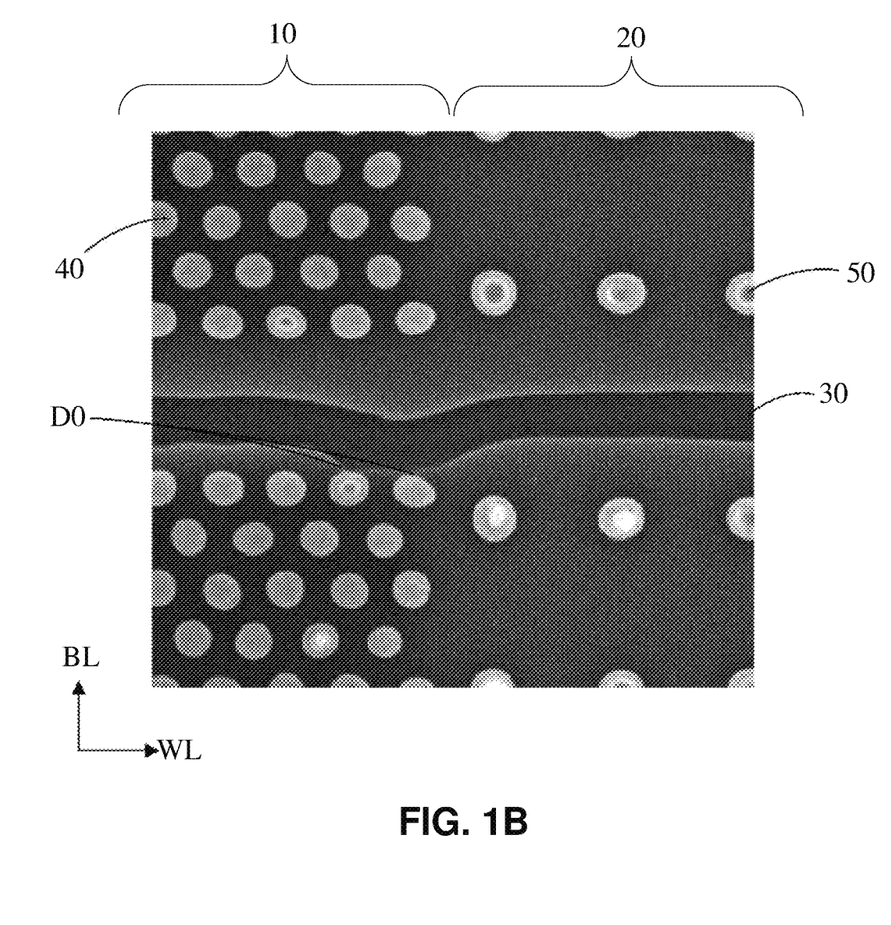

Referring to FIG. 1(B), a picture of a 3D memory device is shown in a top view. As described above, as more oxide/nitride (ON) layers being formed in the memory array, the local stress gradient at the transition area of the core region 10 and the staircase region 20 is increased, resulting in a high possibility of gate line slit structure tilting. As shown in FIG. 1(B), due to the local stress gradient, the tilted gate line slit structure 30 is shorted to the two channel structures 40 that are at the transition area DO of the core region 10 and the staircase region 20, and adjacent to the tilted gate line slit structure 30, thus resulting leakages between word lines and/or leakages between word line and array common source. Such leakage problem can cause significant yield loss (e.g., higher than 70%).

Figure 2:
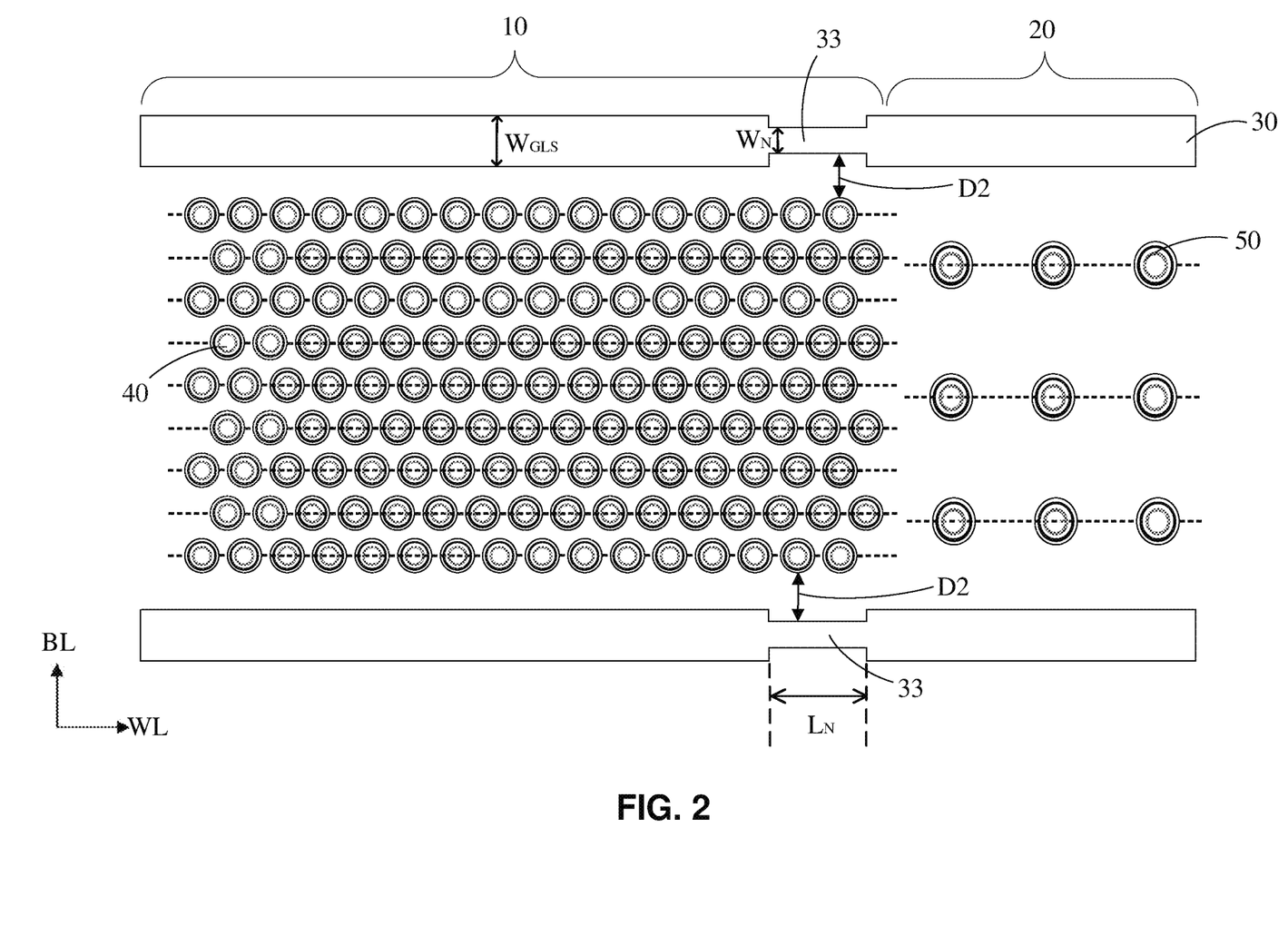
FIG. 2 illustrates a top view of an exemplary 3D memory device in accordance with some embodiments of the present disclosure.

Referring to FIG. 2, a schematic diagram of a 3D memory device according to some embodiments of the present disclosure is shown in a top view. In some embodiments, each gate line slit structure 30 can include a narrow portion 33 at the transition area of the core region 10 and the staircase region 20. As shown in FIG. 2, the narrow portion 33 of the gate line slit structure 30 can have a reduced width $W_N$ in a second lateral direction (e.g., bit line direction "BL"), compared to a nominal width $W_{GLS}$. In some embodiments, the width of the normal portion of the gate line slit structure 30 in the second lateral direction is in a range from 100 nm to 130 nm, such as 110 nm, while the reduced width of the narrow portion 33 of the gate line slit structure 30 in the second lateral direction is in a range from 60 nm to 90 nm, such as about 70 nm.

The location of the narrow portion 33 of the gate line slit structure 30 can correspond to at least two channel structures 40 that are at the boundary of the core region 10 and the staircase region 20. A length LN of the narrow portion 33 of the gate line slit structure 30 in the first lateral direction (e.g., word line direction) depends on the diameter of the channel structures 40 and the distance between adjacent channel structures 40. In some embodiments, the length LN of the narrow portion 33 of the gate line slit structure 30 in the first lateral direction is in a range between 300 nm to 500 nm, such as about 400 nm.

By reducing the width of the narrow portion 33 of the gate line slit structure 30, the distance D2 between the narrow portion 33 of the gate line slit structure 30 and the two channel structures 40 that are at the transition area of the core region 10 and the staircase region 20 and adjacent to the gate line slit structure 30 can be increased to least 120 nm, such as in a range between 120 nm and 150 nm. Therefore, even if a gate line slit structure 30 is tilted due to the local stress gradient at the transition area of the core region 10 and the staircase region 20, the shortage risk between the tilted gate line slit structure 30 and the two channel structures 40 that are at the boundary of the core region 10 and the staircase region 20 and adjacent to the tilted gate line slit structure 30 can be effectively reduced, thereby avoiding the leakages between word lines and/or leakages between word line and array common source. As such, the yield of the 3D memory device can be significantly increased.

Figure 3:
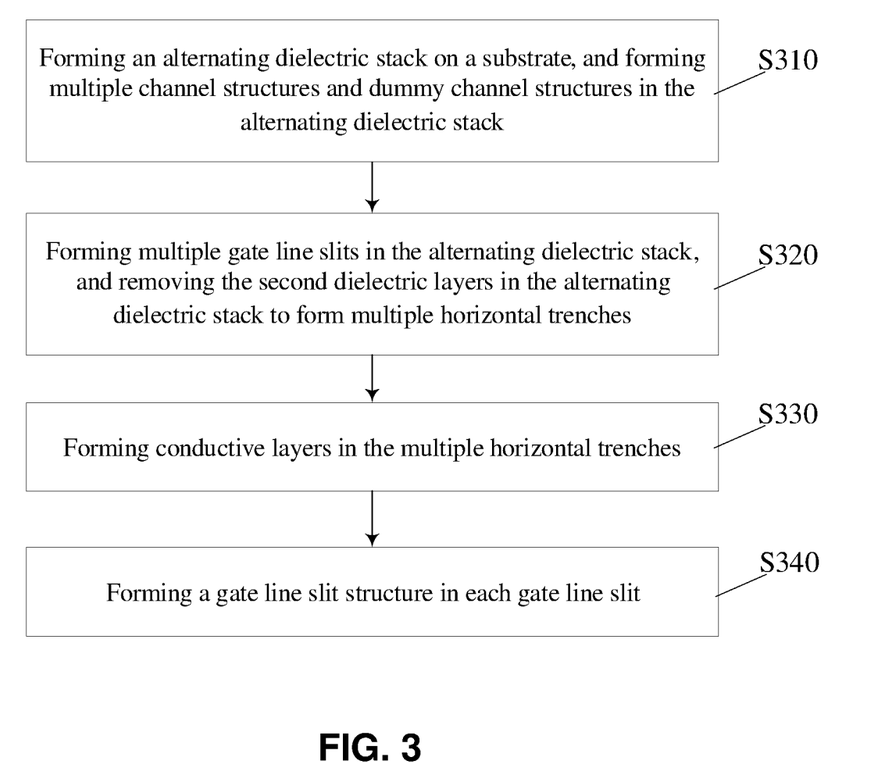
FIG. 3 illustrates a flow diagram of an exemplary method for forming a 3D memory device in accordance with some embodiments of the present disclosure.

Referring to FIG. 3, a flow diagram of an exemplary method for forming a 3D memory device is shown in accordance with some embodiments of the present disclosure. FIGS. 4-7 illustrate cross-sectional views of an exemplary 3D memory device at certain fabricating stages of the method shown in FIG. 3.

As shown in FIG. 3, the method can start at operation S310, in which an alternating dielectric stack can be formed on a substrate, and multiple channel structures and dummy channel structures can be formed in the alternating dielectric stack. In some embodiments, the details of forming the alternating dielectric stack and the multiple channel structures can be referred to U.S. patent application Ser. No. 16/046,847, and U.S. patent application Ser. No. 16/047, 178, the entire contents of which are incorporated herein by references.

Figure 4:
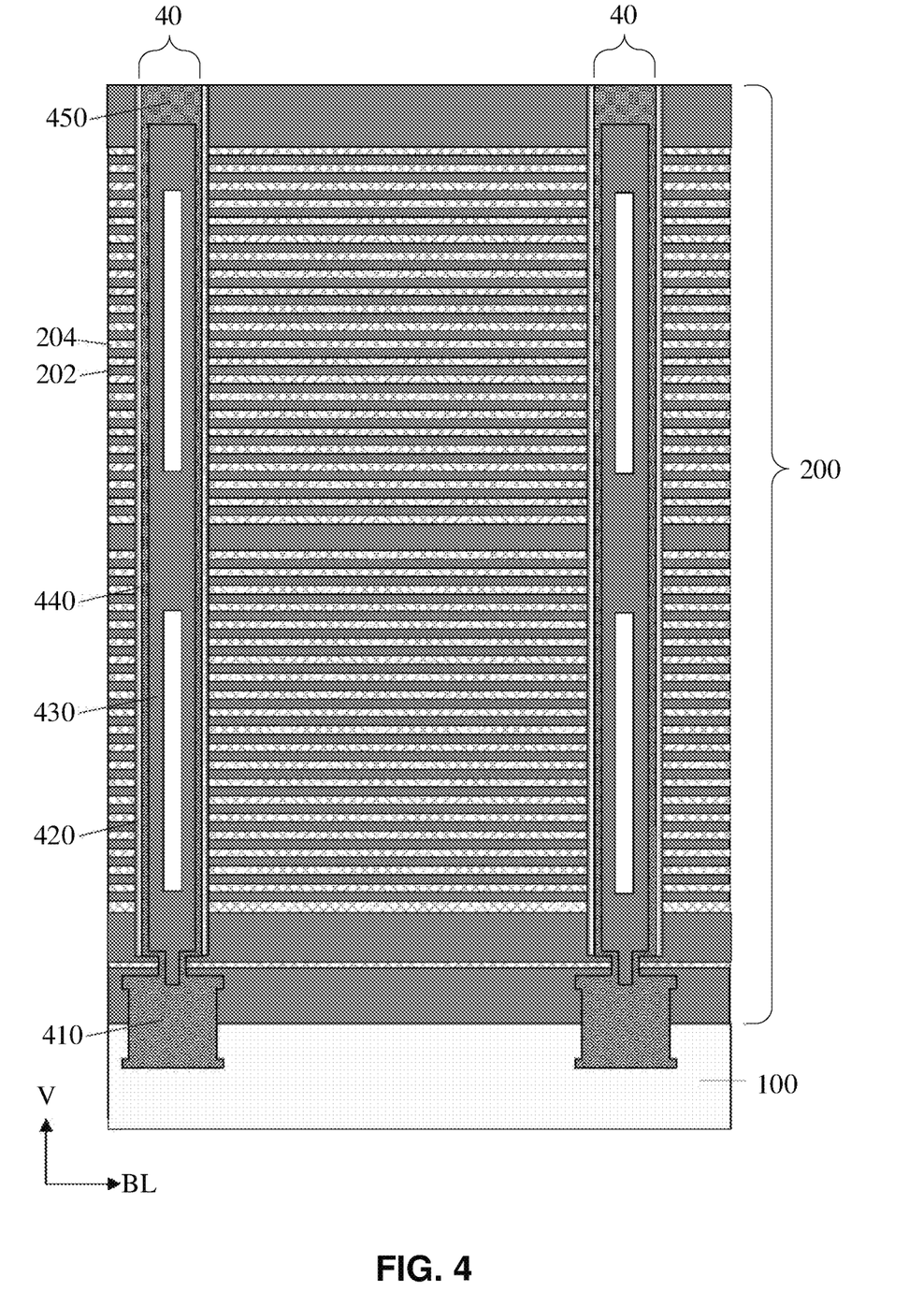
FIGS. 4-7 illustrate cross-sectional views of an exemplary 3D memory device at certain fabricating stages of the method shown in FIG. 3.

As shown in FIG. 4, in some embodiments, the substrate 100 can be any suitable semiconductor substrate having any suitable structure, such as a monocrystalline single-layer substrate, a polycrystalline silicon (polysilicon) single-layer substrate, a polysilicon and metal multi-layer substrate, etc.

The alternating dielectric stack 200 including a plurality of dielectric layer pairs can be formed on the substrate 100. The alternating dielectric stack 200 can include an alternating stack of a first dielectric layer 202 (e.g., silicon oxide) and a second dielectric layer 204 (e.g., silicon nitride) that is different from first dielectric layer, for example. The plurality of first dielectric layers 202 and second dielectric layers 204 are extended in a lateral direction that is parallel to the surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 200 can include a plurality of silicon oxide/nitride layer pairs. Each dielectric layer pair includes a layer of silicon oxide 202 and a layer of silicon nitride 204. The plurality of oxide/nitride layer pairs are also referred to herein as an "alternating oxide/nitride stack." That is, in the alternating dielectric stack 200, multiple oxide layers 202 (shown in the areas with solid gray) and multiple nitride layers 204 (shown in the areas with meshes) alternate in a vertical direction. In other words, except a top and a bottom layer of a given alternating oxide/nitride stack, each of the other oxide layers 202 can be sandwiched by two adjacent nitride layers 204, and each of the nitride layers 204 can be sandwiched by two adjacent oxide layers 202.

Oxide layers can each have the same thickness or have different thicknesses. For example, a thickness of each oxide layer can be in a range from 10 nm to 100 nm, preferably about 25 nm. Similarly, nitride layers can each have the same thickness or have different thicknesses. For example, a thickness of each nitride layer can be in a range from 10 nm to 100 nm, preferably about 35 nm.

It is noted that, in the present disclosure, the oxide layers 202 and/or nitride layers 204 can include any suitable oxide materials and/or nitride materials. For example, the oxide materials can include silicides, and the element of nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 202 and the nitride layers 204. In some embodiments, a total number of layers of the oxide layers 202 and the nitride layers 204 in the alternating dielectric stack 200 is equal to or larger than 128. That is, a number of oxide/nitride layer pairs can be equal to or larger than 64. In some embodiments, the alternating oxide/nitride stack 200 includes more oxide layers or more nitride layers with different materials and/or thicknesses than the oxide/nitride layer pair.

As shown in FIG. 4, multiple channel structures 40 can be in the alternating dielectric stack 200. In some embodiments, the multiple channel structures 40 can penetrate the alternating dielectric stack in a vertical direction ("V"). As shown in FIG. 2, the multiple channel structures 40 can be formed in the core region 10, and can be arranged in a staggered array form. In some embodiments, multiple dummy channel structures 50 (not shown in FIG. 4) can be formed be in the alternating dielectric stack 200 and in the staircase region 20. As shown in FIG. 2, the multiple dummy channel structures 50 can penetrate the alternating dielectric stack 200 in the vertical direction and can be arranged in an array form. A distance between adjacent channel structures 40 is less than a distance between adjacent dummy channel structures 50. It is noted that, in some embodiments, the multiple channel structures 40 and the multiple dummy channel structures 50 can be formed simultaneously in same fabricating process.

In some embodiments, forming the multiple channel structures 40 and the multiple dummy channel structures 50 can include forming multiple channel holes to penetrate the alternating dielectric stack. In some embodiments, fabricating process for forming the multiple channel holes can include forming a hard mask layer on the alternating dielectric stack 200, and coating a photoresist layer 540 on the hard mask layer. In some embodiments, fabricating process for forming the multiple channel holes can further include etching the alternating dielectric stack 200 to form the multiple channel holes by a patterning process. A subset of channel holes in the core region 10 can be formed and arranged in a staggered array form, while another subset of channel holes in the staircase region 20 can be formed and arranged in an array form. Each channel hole can completely penetrate the alternating dielectric stack 200, and can extend into the substrate 100. The etching process to form the multiple channel holes can be a dry etching, a wet etching, or a combination thereof. After the etching process, the photoresist layer and the hard mask layer can be removed, and a cleaning process can be performed to clean the multiple channel holes.

In some embodiments, a channel structure 40 can be formed in each channel hole in the core region 10. In some embodiments, the channel structure 40 can include an epitaxial layer 410 on the bottom of the channel hole, a functional layer 420 on the sidewall of the channel hole, and a dielectric filling structure 430 in the channel hole, a channel layer 440 between the functional layer 420 and the dielectric filling structure 430, and a channel plug 450 on the top portion of the channel hole. The functional layer 420 can include a barrier layer, a storage layer, and a tunneling layer. In some embodiments, a dummy channel structures 50 can be formed in each channel hole in the staircase region 20 during a same process of forming the channel structure 40, and have a same structure as the channel structure 40.

In some embodiments, the fabricating processes for forming the multiple channel structure 40 and/or the multiple dummy channel structure 50 can include the following steps.

In some embodiments, an epitaxial layer 410 can be formed on the bottom of the each channel hole and on the substrate 100 that is exposed by the channel hole. In some embodiments, the epitaxial layer 410 can be a polycrystalline silicon (polysilicon) layer formed by a selective epitaxial growth (SEG) process. In some embodiments, the epitaxial layer 410 may not be directly formed on the surface of the substrate 100. One or more layers can be formed between the epitaxial layer 410 and the substrate 100. That is, the epitaxial layer 410 overlays the substrate 100.

In some embodiments, a functional layer 420 can be formed covering the sidewall of each channel hole and the top surface of the epitaxial layer 410 in each channel hole. In some embodiments, the functional layer 420 can include a barrier layer, a storage layer, and a tunneling layer, and can be formed on the sidewall of the channel hole. In some embodiments, the barrier layer, the storage layer, and the tunneling layer can be formed by any suitable thin film deposition processes successively, such as chemical vapor deposition (CVD) processes, physical vapor deposition (PVD) processes, atomic layer deposition (ALD) processes, or any suitable combination thereof. The barrier layer can be formed to cover the sidewall of each channel hole and the top surface of the epitaxial layer 410 in each channel hole.

The storage layer can be formed to cover the barrier layer, and the tunneling layer can be formed to cover the storage layer.

The barrier layer can be used for blocking the outflow of the electronic charges. In some embodiments, the barrier layer can be a silicon oxide layer or a combination of silicon oxide/silicon oxynitride/silicon oxide ($SiO_2$—SiON—$SiO_2$) multi-layer stack. In some embodiments, the barrier layer includes high dielectric constant (high-k) dielectrics (e.g., aluminum oxide). In one example, the barrier layer is mainly an oxide layer formed by In-Situ Steam Generation (ISSG) oxidation after a silicon nitride deposition process. In some embodiments, a thickness of the barrier layer can be less than 20 nm.

The storage layer can be used for storing electronic charges. The storage and/or removal of charges in the storage layer can impact the on/off state and/or a conductance of the semiconductor channel. The storage layer can include polycrystalline silicon (polysilicon) or silicon nitride. The storage layer can include one or more films of materials including, but are not limited to, silicon nitride, silicon oxynitride, a combination of silicon oxide and silicon nitride, or any combination thereof. In some embodiments, the first storage layer 8 can include a nitride layer formed by using one or more deposition processes.

The tunneling layer can be used for tunneling electronic charges (electrons or holes). The tunneling layer can be dielectric materials including, but not limited to, silicon oxide, silicon nitride, silicon oxynitride, or any combination thereof. In some embodiments, the tunneling layer can be an oxide layer formed by using a deposition process. In some embodiments, a thickness of the tunneling layer can be less than 20 nm.

In some embodiments, portions of the functional layer 420 that are either outside of the channel holes can be removed by any suitable techniques, such as backside grinding, and/or chemical mechanical polishing (CMP), etc. Further, portions of the functional layer 420 on the bottom of each channel hole 500 can be removed by any suitable etching process, such as a dry etch (e.g., a punch etch) and/or a wet etch, to form a recess that exposes or extends into the epitaxial layer 410.

A channel layer 440 can be formed covering the functional layer 420 and contacting to the epitaxial layer 410. The channel layer 440 can be formed by any suitable thin film deposition processes including, but not limited to, chemical vapor deposition (CVD), physical vapor deposition. (PVD) or atomic layer deposition (ALD), or a combination thereof. In some embodiments, a thickness of the channel layer 440 can be in a range from about 10 nm to about 30 nm.

A dielectric filling structure 430 can be formed to fill each channel hole. The material of the dielectric filling structure 430 can include any suitable dielectric material, such as silicon oxide. In some embodiments, one or more atomic layer deposition (ALD) processes can be performed to form the dielectric filling structure 430 in each channel hole. In some embodiments, the dielectric filling structure 430 can include one or more air gaps.

In some embodiments, a top portion of the dielectric filling structure 430 close to the opening of the channel holes in the core region 10 can be removed by the an etching back process (also referred as an recess etching process). The etching back process can include, but not limited to, a wet etching, a dry etching, or a combination thereof. As such, a round recess can be formed in each channel hole in the core region 10 and above the remaining portion of the dielectric filling structure 430. A following diluted hydrofluoric acid (HF) cleaning process can be performed to clean the round recesses.

A channel plug 450 can be formed to fill the round recesses in the channel holes. The channel plug 450 can be an amorphous silicon layer or a polysilicon layer formed by using a thin film deposition process, such as a low pressure chemical vapor deposition (LPCVD) process, plasma enhanced chemical vapor deposition (PECVD) process, atomic layer deposition (ALD) or any other suitable processes. The channel plug 450 is electrically in contact with the channel layer 440. The top surface of the channel plug 450 can be planarized by any suitable techniques, such as backside grinding, and/or chemical mechanical polishing (CMP).

Accordingly, multiple channel structures 40 in the core region 10 and multiple dummy channel structure 50 in the staircase region 20 are formed simultaneously.

Referring back to FIG. 3, in a next operation S320, multiple gate line slits can be formed in the alternating dielectric stack, and the second dielectric layers in the alternating dielectric stack can be removed through the multiple gate line slits.

Figure 5:
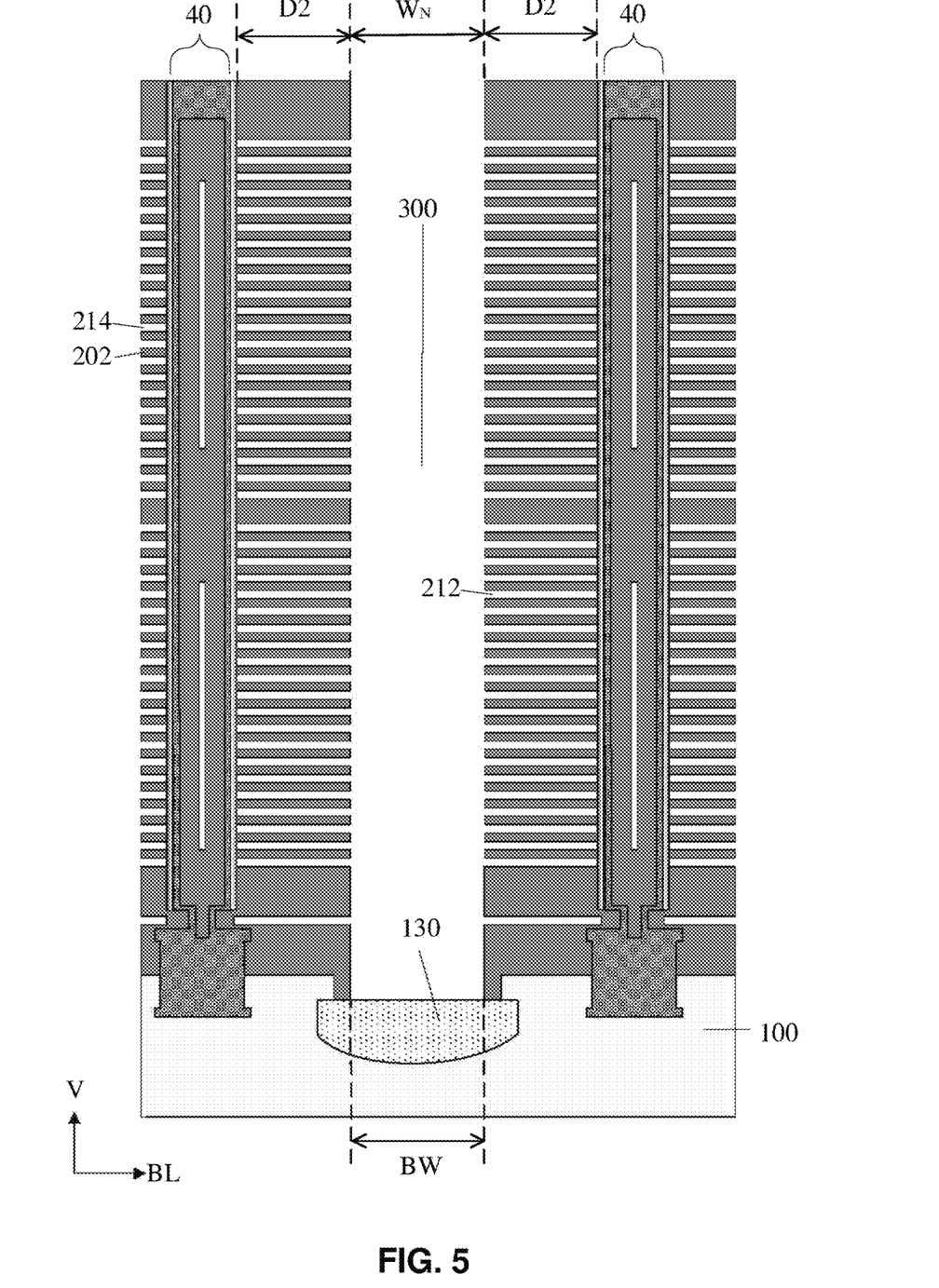

As shown in FIG. 5, each gate line slit 300 can vertically penetrate through the alternating dielectric stack 200, and extend substantially in a straight line along the word line direction ("WL"). The multiple gate line slits 300 can be formed by forming a mask layer over the alternating dielectric stack 200 and patterning the mask using, e.g., photolithography, to form openings corresponding to the multiple gate line slits in the patterned mask layer. It is noted that, each opening can include a narrow portion at the transition area of the core region 10 and the staircase region 20. A suitable etching process, e.g., dry etch and/or wet etch, can be performed to remove portions of the alternating dielectric stack 200 exposed by the openings until the multiple expose the substrate 100. The mask layer can be removed after the formation of the multiple gate line slits 300.

The formed gate line slit 300 can include a narrow portion (corresponding to the narrow portion 33 of the gate line slit structure 30 as shown in FIG. 2) at the transition area of the core region 10 and the staircase region 20. The narrow portion of the gate line slit 300 can have a reduced width BW measured at the bottom of the gate line slit 300 along the bit line direction ("BL"). In some embodiments, the reduced width BW of the narrow portion of the gate line slit 300 can be within a range from 60 nm to 90 nm, such as 70 nm, while the width of the normal portion of the gate line slit 300 measured at the bottom of the gate line slit 300 along the bit line direction can be within a range from 100 nm to 130 nm, such as about 110 nm.

The location of the narrow portion of the gate line slit 300 can correspond to at least two channel structures 40 that are at the boundary of the core region 10 and the staircase region 20 (referred to the corresponding narrow portion 33 of the gate line slit structure 30 as shown in FIG. 2). A length LN of the narrow portion of the gate line slit 300 along the word line direction ("WL") depends on the diameter of the channel structures 40 and the distance between adjacent channel structures 40. In some embodiments, a length LN of the narrow portion of the gate line slit 300 is not less than two times a diameter of the channel structures 40 plus a distance between two adjacent channel structures 40. In some embodiments, the length LN of the narrow portion of the gate line slit 300 in the first lateral direction is in a range between 300 nm to 500 nm, such as about 400 nm.

Since the width of the narrow portion of the gate line slit 300 is reduced comparing to the width of the normal portion of the gate line slit 300, the distance D2 between the gate line slit 300 and the two channel structures 40 that are at the transition area of the core region 10 and the staircase region 20 and adjacent to the gate line slit 300 can be increased, such as equal to or greater than 120 nm.

In some embodiments, a doped region 130 can be formed at a bottom of each gate line slit 300 by using any suitable doping process, such as ion implantation and/or thermal diffusion through the gate line slits 300. The dopant in doped region 130 can be any suitable N+ or P+ ions. After forming a conductive wall in each gate line slit 300 in a subsequent process, the lower end of each conductive wall formed in subsequent processed can be in contact with a corresponding doped region 130. It is understood that doped regions can be formed in an earlier fabrication stage, for example, prior to the formation of the alternative dielectric structure 200, according to some embodiments.

As shown in FIG. 5, the second dielectric layers 204 in the alternating dielectric stack 200 can be removed to form multiple horizontal trenches 214. The multiple horizontal trenches 214 can extend in a horizontal direction, and can be used as spaces for a gate structure to be formed in the subsequent processes. It is noted that, the term "horizontal/horizontally" used herein means nominally parallel to a lateral surface of a substrate. As described above, the second dielectric layers 204 in the alternating dielectric stack 200 are used as sacrificial layers, and are removed by used any suitable etching process, e.g., an isotropic dry etch or a wet etch. The etching process can have sufficiently high etching selectivity of the material of the second dielectric layers 204 over the materials of the first dielectric layer 202, such that the etching process can have minimal impact on the first dielectric layer 202. The isotropic dry etch and/or the wet etch can remove second dielectric layers 204 in various directions to expose the top and bottom surfaces of each first dielectric layer 202. As such, multiple horizontal trenches 214 can then be formed between first dielectric layers 210.

In some embodiments, the second dielectric layers 204 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10V. In some embodiments, the second dielectric layers 204 include silicon nitride and the etchant of the wet etch includes phosphoric acid.

After the second dielectric layers 204 are removed, the multiple gate line slits 300 and multiple horizontal trenches 214 can be cleaned by using any suitable cleaning process. For example, a phosphoric acid rinsing process can be performed to remove the impurities on the inner wall of the horizontal trenches 214. In some embodiments, a rinsing temperature can be in a range from about 100° C. to about 200° C., and a rinsing time can be in a range from about 10 minutes to about 100 minutes. After the cleaning process, the top surfaces 212 and bottom surfaces 214 of the first dielectric layers 210, and the outside sidewall portions of functional layers 310 originally surrounded by the second dielectric layers 204 can be exposed through the multiple horizontal trenches 214.

Referring back to FIG. 3, the method proceeds to operation S330, in which a conductive layer can be formed to fill each horizontal trench.

Figure 6:
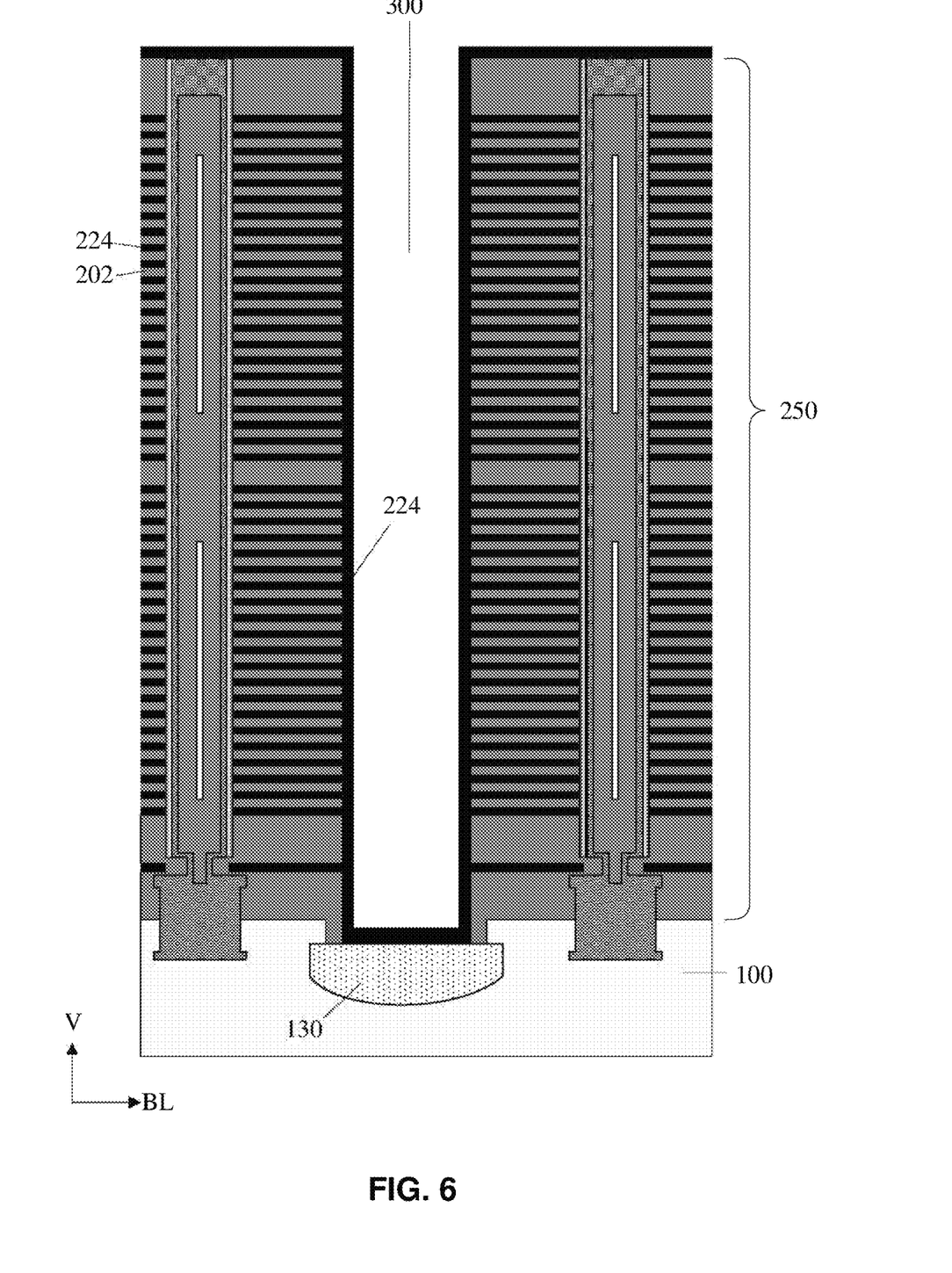

As shown in FIG. 6, the conductive layer 224 can be formed by filling the multiple horizontal trenches 214 with a suitable gate electrode metal material. The conductive layer 224 can provide the base material for the subsequently-formed word lines (i.e., gate electrodes). The gate electrode metal material can include any suitable conductive material, e.g., tungsten, aluminum, copper, cobalt, or any combination thereof, for forming the word lines (i.e., gate electrodes). The gate electrode material can be deposited into horizontal trenches 214 using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layer 224 include tungsten formed by CVD. In some embodiments, a thickness of the conductive layer 224 is in a range from 30 nm to 40 nm, such as 35 nm.

In some embodiments, before forming the conductive layer 224, an insulating layer (not shown) can be formed in each of the multiple horizontal trenches 214. The insulating layer can be used as a gate dielectric layer for insulating the respective word line (i.e., gate electrode) formed in the subsequent processes from the adjacent first dielectric layer 212. In some embodiments, the insulating layer can have single layer structure or a laminated structure, and can be formed to cover the exposed surfaces of the horizontal trenches 214 with one or more suitable insulating materials, such as high dielectric constant (high k-value) dielectrics (e.g., aluminum oxide), titanium nitride. For example, one or more suitable deposition processes, such as CVD, PVD, and/or ALD, can be utilized to deposit the one or more insulating materials into the horizontal trenches 214. In some embodiments, a recess etch and/or a chemical-mechanical planarization (CMP) can be used to remove excessive insulating material(s). The one or more insulating materials can include any suitable materials that provide electric insulating function. For example, the one or more insulating materials can include silicon oxide, silicon nitride, silicon oxynitride, aluminum oxide, titanium nitride, etc., and/or any suitable combinations thereof. In some embodiments, multiple insulating layers can have different insulating materials.

In some embodiments, after forming the conductive layer 224, a portion of the conductive layer 224 can be removed by a recess etching process. In some embodiments, in order to ensure the insulation between multiple gates, a recess etching process, such as a wet etching process, can be performed to remove the exposed portions of the conductive layer 224 that are on the sidewall of the gate line slits 300. It is noted that, since the thickness of the conductive layer 224 is about 35 nm, a minimum value of the reduced width D2 of the narrow portion of the gate line slit 300 is at least 70 nm, which can ensure the portion of the conductive layer 224 on the sidewall of the gate line slits 300 to be completely removed by the recess etching process. After the recess etching process, the remaining portions of the conductive layer 224 in each horizontal trenches 214 can form multiple word lines (i.e., gate electrodes).

As such, the alternating dielectric stack 200 can be transformed into an alternating conductive/dielectric stack 250 including multiple conductive/dielectric layer pairs. Each conductive/dielectric layer pair can include a first dielectric layer 202 and a conductive layer 224. It is noted that, the process of replacing the multiple second dielectric layer 204 to the multiple conductive layers 224 is referred as a gate replacement process, or a word line replacement process.

Figure 7:
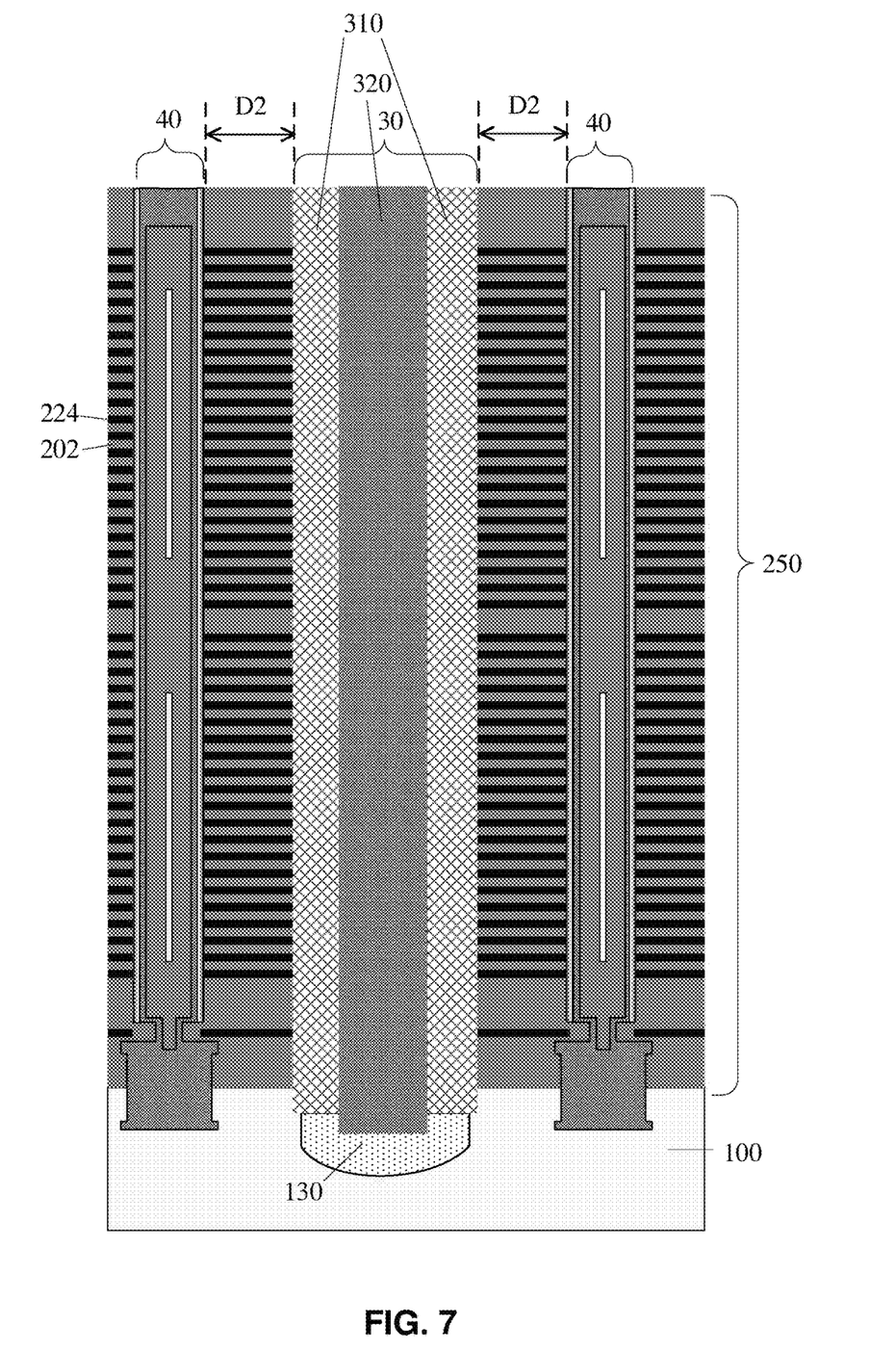

Referring back to FIG. 3, the method proceeds to operation 5340, in which a gate line slit structure can be formed in each gate line slit. In some embodiments as shown in FIG.

7, the gate line slit structure 30 can include two spacer layers 310 and a conductive wall 320 sandwiched by the two spacer layer 310.

In some embodiments, each spacer layer 310 can be formed on the sidewalls of the multiple gate line slits 300 and have a laminated structure. The spacer layer 310 is also referred as a gate line spacer (GLSP) layer, and can include multiple layers (not shown). The spacer layer 310 can be used to provide electrical insulation between the conductive layers 222 (i.e., word lines) and the conductive wall 320. In some embodiments, the fabricating process for forming spacer layer 310 can include forming multiple spacer sublayers on the sidewalls of the multiple gate line slits 300 by using multiple deposition processes, such as one or more atomic layer deposition (ALD) process. The materials of the multiple spacer sublayers can include low temperature oxide materials (e.g., silicon oxide), high k-value materials (e.g., silicon nitride), etc.

In some embodiments, after forming the spacer layer 310, an etching process can be performed to shaping the spacer layer 310. For example, portions of the spacer layer 310 at the bottom of each gate line slit 300 can be removed to expose the doping region 130 of the substrate 100. In some embodiments, a groove can be formed into the doping region 130 of the substrate 100. Further, portions of the spacer layer 310 that are outside the multiple gate line slits 300 can be removed in the same etching process. As such, the spacer layer 310 can be formed on the sidewalls of the multiple gate line slits 300.

The conductive wall 320 can be formed to fill each of the multiple gate line slits 300. As shown in FIG. 7, the conductive wall 320 can be sandwiched between the two spacer layers 310 in each gate line slit 300. In some embodiments, the conductive wall 320 can be formed by depositing any suitable conductive material, such as metal materials including tungsten, aluminum, copper, polysilicon, silicides, and/or combinations thereof, etc. The conductive material can be deposited into the multiple gate line slits 300 by using any suitable deposition method such as CVD, physical vapor deposition (PVD), plasma-enhanced CVD (PECVD), sputtering, metal-organic chemical vapor deposition (MOCVD), and/or ALD. In some embodiments, the conductive wall 320 can include tungsten formed by CVD. The conductive wall 320 is in contact with the doped region 130 at the bottom of the gate line slit 300, and is used as an array common source (ACS) of the multiple NAND strings. After forming the conductive wall 320, a chemical-mechanical planarization (CMP) process can be performed to planarize the top surface of the formed structure, as shown in FIG. 7.

Accordingly, a 3D memory device and a fabricating method thereof are disclosed. In the disclosed method, a mask including multiple opening for forming the multiple gate line slits can have a narrow portion near the transition area of the core region and the staircase region. The formed gate line slit structures can include a narrow portion at the transition area of the core region and the staircase region. Specifically, the narrow portion of each gate line slit structure can have a reduced width in the bit line direction. As such, a distance between the narrow portion of each gate line slit structure and the adjacent channel structures at the transition area of the core region and the staircase region can be increased to avoid potential leakages between word lines and/or between word line and array common source. As such, the yield of the 3D memory device can be significantly increased.

To be added when claims are finalized.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming an alternating dielectric stack on a substrate;
   forming a plurality of channel structures and dummy channel structures vertically penetrating the alternating dielectric stack, wherein the channel structures are located in a core region, and the dummy channel structures are located in a staircase region; and
   forming a gate line slit structure vertically penetrating the alternating dielectric stack, laterally extending in a first direction, and, at least in the core region, having a first width defined along a second direction different from the first direction;
   wherein the gate line slit structure includes a narrow portion that has a reduced width less than the first width, and wherein the narrow portion is disposed adjacent to a boundary of the core region and the staircase region.

2. The method of claim 1, wherein forming the gate line slit structure comprises:
   patterning a mask layer to form an opening extending in the first direction on the alternating dielectric stack, wherein the opening includes a narrow portion having a reduced width along the second direction;
   using the patterned mask layer to form a gate line slit vertically penetrating the alternating dielectric stack; and
   forming the gate line slit structure in the gate line slit.

3. The method of claim 2, wherein forming the gate line slit comprises:
   etching the alternating dielectric stack based on the patterned mask layer to form the gate line slit, such that a narrow portion of the formed gate line slit is close to a transition area of the core region and the staircase region.

4. The method of claim 2, wherein forming the gate line slit structure comprises:
   forming a doped region in the substrate at a bottom of the gate line slit;
   forming two spacer layers on both sidewalls of the gate line slit; and
   forming a conductive wall between the two spacer layers, wherein the conductive wall is electrically in contact with the doped region.

5. The method of claim 2, wherein forming the gate line slit structure comprises:
   forming the gate line slit structure in the gate line slit, such that a distance between the gate line slit structure and at least two channel structures that are adjacent to the gate line slit structure and close to a transition area of the core region and the staircase region is not less than about 120 nm.

6. The method of claim 1, wherein forming the alternating dielectric stack comprises:
   forming at least 64 dielectric layer pairs stacked in a vertical direction, wherein each dielectric layer pair includes a first dielectric layer and a second dielectric layer that is different from the first dielectric layer.

7. The method of claim 1, wherein forming the plurality of channel structures and dummy channel structures comprises:
   simultaneously forming a plurality of channel holes vertically penetrating the alternating dielectric stack, wherein a first subset of channel holes in the core region are arranged in a staggered array form, and a second subset of channel holes in the staircase region are arranged in an array form; and
   simultaneously forming the channel structures in the first subset of channel holes and the dummy channel structures in the second subset of channel holes.

8. The method of claim 7, wherein simultaneously forming the plurality of channel structures and dummy channel structures comprises:
   forming an epitaxial layer on a surface of the substrate that is exposed by each channel hole;
   forming a functional layer on sidewalls of each channel hole, followed by;
   forming a channel layer covering the functional layer and in contact with the epitaxial layer in each channel hole, followed by;
   forming a dielectric filling structure filling each channel hole, followed by; and
   forming a channel plug on a top portion of each channel hole and on the dielectric filling structure.

9. The method of claim 6, before forming the gate line slit structure in the gate line slit, further comprising:
   replacing the second dielectric layers in the alternating dielectric stack with conductive layers through the gate line slit.

10. The method of claim 9, wherein replacing the second dielectric layers in the alternating dielectric with conductive layers comprises:
    removing the second dielectric layers in the alternating dielectric stack through the gate line slit to form a plurality of horizontal trenches; and
    forming the conductive layers in the plurality of horizontal trenches.

11. A three-dimensional (3D) memory device, comprising:
    an alternating conductive/dielectric stack on a substrate;
    a plurality of channel structures and dummy channel structures vertically penetrating the alternating conductive/dielectric stack, wherein the channel structures are located in a core region, and the dummy channel structures are located in a staircase region; and
    a gate line slit structure vertically penetrating the alternating conductive/dielectric stack, laterally extending in a first direction in the core region and the staircase region, and having a first width defined along a second direction different from the first direction;
    wherein the gate line slit structure includes a narrow portion that has a reduced width less than the first width, and wherein the narrow portion is disposed adjacent to a boundary of the core region and the staircase region and is between portions of the gate line slit structure having the first width.

12. The device of claim 11, wherein the first direction is a word line direction, and the second direction is a bit line direction.

13. The device of claim 11, wherein the reduced width of the narrow portion of the gate line slit structure is at least 40 nm less than a normal width of a normal portion of the gate line slit structure.

14. The device of claim 11, wherein the reduced width of the narrow portion of the gate line slit structure is at least 70 nm.

15. The device of claim 11, wherein a length of the narrow portion of the gate line slit structure along the first direction is not less than two times a diameter of the channel structures plus a distance between two adjacent channel structures.

16. The device of claim 11, wherein a length of the narrow portion of the gate line slit structure along the first direction is not less than a range between 300 nm to 500 nm.

17. The device of claim 11, wherein the gate line slit structure comprises a conductive wall between two spacer layers and is electrically in contact with a doped region of the substrate.

18. The device of claim 11, wherein a distance between the gate line slit structure and at least two channel structures that are adjacent to the gate line slit structure and close to a transition area of the core region and the staircase region is not less than about 120 nm.

19. The device of claim 11, wherein the alternating dielectric stack comprises at least 64 conductive/dielectric layer pairs stacked in a vertical direction.

20. The device of claim 11, wherein each channel structure comprises:
    an epitaxial layer on a bottom portion of a channel hole;
    a functional layer on a sidewall of the channel hole;
    a channel layer covering the functional layer and in contact with the epitaxial layer;
    a dielectric filling structure filling the channel hole; and
    a channel plug on a top portion of the channel hole and on the dielectric filling structure.

* * * * *